United States Patent
Diwan et al.

(10) Patent No.: US 10,752,989 B2
(45) Date of Patent: Aug. 25, 2020

(54) METHODS OF APPLYING SILANE COATINGS

(71) Applicants: Moxtek, Inc., Orem, UT (US); Brigham Young University, Provo, UT (US)

(72) Inventors: Anubhav Diwan, Provo, UT (US); Matt Linford, Orem, UT (US)

(73) Assignee: Moxtek, Inc., Orem, UT (US)

( * ) Notice: Subject to any disclaimer, the term of this patent is extended or adjusted under 35 U.S.C. 154(b) by 196 days.

(21) Appl. No.: 16/028,039

(22) Filed: Jul. 5, 2018

(65) Prior Publication Data
US 2019/0032202 A1    Jan. 31, 2019

Related U.S. Application Data

(60) Provisional application No. 62/537,291, filed on Jul. 26, 2017, provisional application No. 62/537,270, filed on Jul. 26, 2017.

(51) Int. Cl.
*G02B 1/14* (2015.01)
*C23C 16/40* (2006.01)
(Continued)

(52) U.S. Cl.
CPC .......... *C23C 16/402* (2013.01); *C23C 16/455* (2013.01); *C23C 16/45555* (2013.01);
(Continued)

(58) Field of Classification Search
CPC . C23C 16/0272; C23C 16/402; C23C 16/401; G02B 1/14; G02B 5/3058
(Continued)

(56) References Cited

U.S. PATENT DOCUMENTS

| 8,765,221 B2 | 7/2014 | Miyoshi et al. |
| 2003/0227678 A1* | 12/2003 | Lines .................. G02B 5/3058 359/485.05 |

(Continued)

FOREIGN PATENT DOCUMENTS

JP    2004138762 A    5/2004

OTHER PUBLICATIONS

International Search Report dated Oct. 31, 2018, in International Application No. PCT/US2018/041117, filed Jul. 6, 2018; 7 pages.

*Primary Examiner* — Elizabeth A Burkhart
(74) *Attorney, Agent, or Firm* — Thorpe, North & Western, LLP

(57) ABSTRACT

A method of vapor depositing a silane chemical onto a wire grid polarizer can include introducing a silane chemical and water into a chamber where the wire grid polarizer is located. The silane chemical and the water can be in a gaseous phase in the chamber. The silane chemical and the water can be maintained simultaneously in the gaseous phase in the chamber for period of time. The silane chemical and the water can react to form a $(R^1)_2Si(OH)_2$ molecule, where each $R^1$ is independently any chemical element or group. A silane coating can be formed on the wire grid polarizer from a chemical reaction of the $(R^1)_2Si(OH)_2$ molecule with the wire grid polarizer and with other $(R^1)_2Si(OH)_2$ molecules. The silane coating can be relatively thick and multi-layer. A thicker or multi-layer silane coating can have improved high temperature resistance relative to a thinner or mono-layer silane coating.

21 Claims, 2 Drawing Sheets

Figure 1:
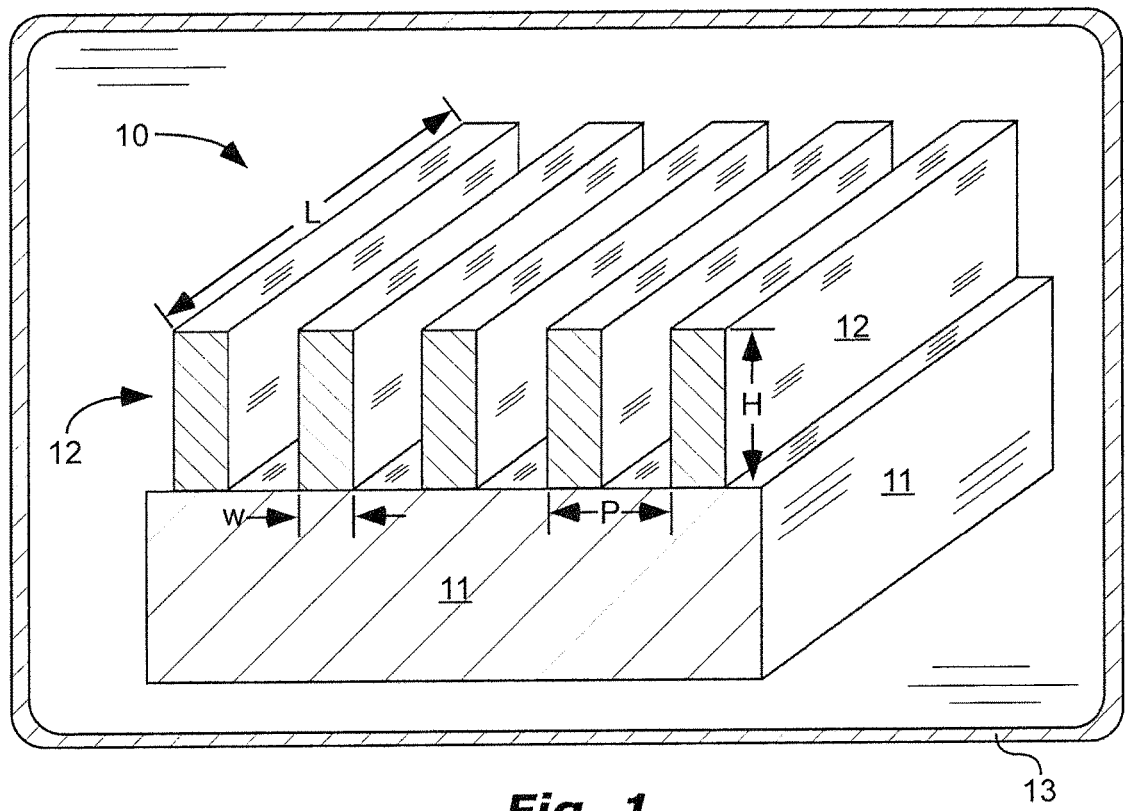

(51) Int. Cl.
*C23C 16/455* (2006.01)
*C23C 16/52* (2006.01)
*G02B 5/30* (2006.01)

(52) U.S. Cl.
CPC ............... *C23C 16/52* (2013.01); *G02B 1/14* (2015.01); *G02B 5/3058* (2013.01)

(58) Field of Classification Search
USPC ..................................................... 427/163.1
See application file for complete search history.

(56) References Cited

U.S. PATENT DOCUMENTS

| | | | |
|---|---|---|---|
| 2005/0247120 A1* | 11/2005 | Hoffmann | B05D 1/60 73/170.24 |
| 2005/0271893 A1* | 12/2005 | Kobrin | B05D 1/185 428/633 |
| 2007/0020392 A1 | 1/2007 | Kobrin et al. | |
| 2012/0026456 A1* | 2/2012 | Nishimoto | C23C 14/083 351/159.01 |
| 2014/0209562 A1 | 7/2014 | LaVoie et al. | |
| 2016/0291209 A1* | 10/2016 | Diwan | G02B 5/3058 |
| 2016/0291226 A1 | 10/2016 | Linford et al. | |
| 2016/0291227 A1 | 10/2016 | Nielson et al. | |

\* cited by examiner

METHODS OF APPLYING SILANE COATINGS

CLAIM OF PRIORITY

This application claims priority to U.S. Provisional Patent Application Nos. 62/537,291 and 62/537,270, both filed on Jul. 26, 2017, which are incorporated herein by reference.

FIELD OF THE INVENTION

The present application is related generally to silane chemistry used as a protective surface layer on a wire grid polarizer.

BACKGROUND

Some devices (e.g. wire grid polarizers) have small, delicate features which can include nm-sized dimensions. Such delicate features can be damaged by tensile forces in water or other liquid on the device. These delicate features may need protection from such tensile forces.

Although many protective chemistries and methods of application have been developed, they can have disadvantages. One disadvantage of some of these protective chemistries is insufficient durability, particularly high-temperature durability. A disadvantage of some methods of applying these protective chemistries (e.g. immersion deposition) is dissolution of an outer material of the device while applying the protective chemistry. Other disadvantages of such methods can include non-uniform protective chemistry thickness, waste disposal, health hazards, rinsing residue, and damage to manufacturing equipment.

SUMMARY

It has been recognized that it would be advantageous to provide protective chemistry that can protect devices from corrosion or other damage from liquids, particularly with protective chemistry that has high-temperature durability. It has also been recognized that it would be advantageous to provide methods of application of protective chemistry that avoid dissolving the device during application, that provide a more uniform protective chemistry thickness, that minimize waste disposal problems and health hazards, that avoid leaving rinsing residue, and that avoid or minimize damage to manufacturing equipment. The present invention is directed to various embodiments of a method of depositing a silane chemical that satisfy these needs. Each embodiment may satisfy one, some, or all of these needs.

The method can comprise vapor depositing a silane chemical onto a wire grid polarizer by placing the wire grid polarizer into a chamber and introducing a silane chemical and water into the chamber, the silane chemical and the water being in a gaseous phase in the chamber.

In one embodiment, the method can further comprise (a) maintaining the silane chemical and the water simultaneously in the gaseous phase in the chamber, (b) reacting the silane chemical and the water in the chamber to form $(R^1)_2Si(OH)_2$ molecules, $R^1Si(OH)_3$ molecules, or both, where each $R^1$ is independently any chemical element or group, and (c) forming a silane coating on the device from a chemical reaction of the $(R^1)_2Si(OH)_2$ molecules, $R^1Si(OH)_3$ molecules, or both, with the device and with other $(R^1)_2Si(OH)_2$ molecules, $R^1Si(OH)_3$ molecules, or both.

In another embodiment, the method can further comprise forming a silane coating with multiple layers on the device, with silane in each layer chemically bonding to silane in an adjacent layer, from a chemical reaction of the $(R^1)_2Si(OH)_2$ molecules, $R^1Si(OH)_3$ molecules, or both, with the device and with other $(R^1)_2Si(OH)_2$ molecules, $R^1Si(OH)_3$ molecules, or both.

BRIEF DESCRIPTION OF THE DRAWINGS (DRAWINGS MIGHT NOT BE DRAWN TO SCALE)

FIG. 1 is a schematic, cross-sectional side-view of a chamber 13 with a device 10 therein, which chamber 13 can be used for vapor deposition of a silane chemical onto the device 10, in accordance with an embodiment of the present invention.

Figure 2:
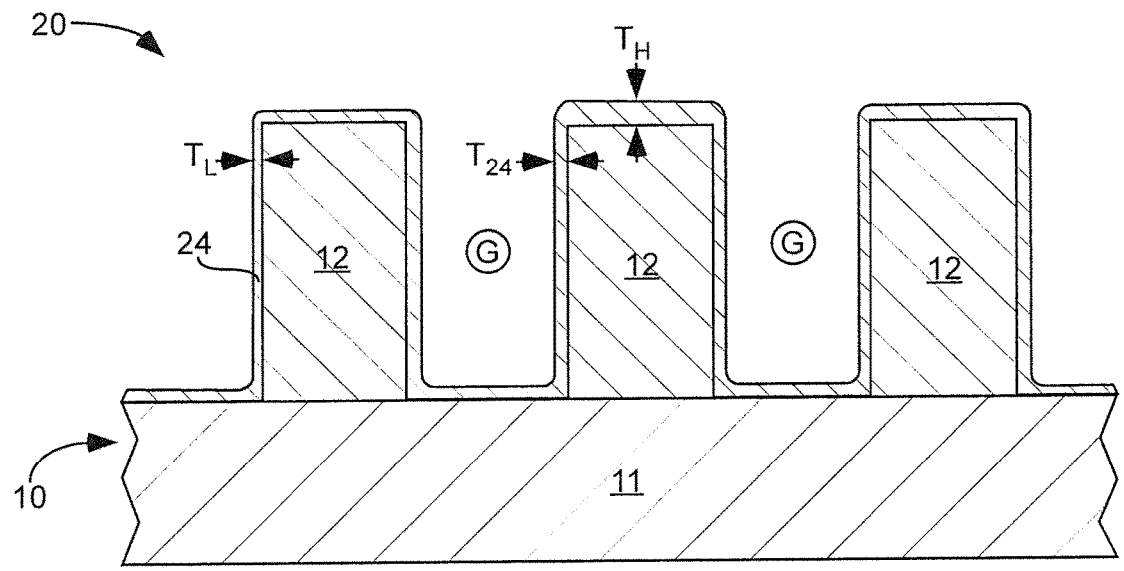

FIG. 2 is a schematic, cross-sectional side-view of a coated device 20 comprising a device 10 with a silane coating 24, in accordance with an embodiment of the present invention.

Figure 3:
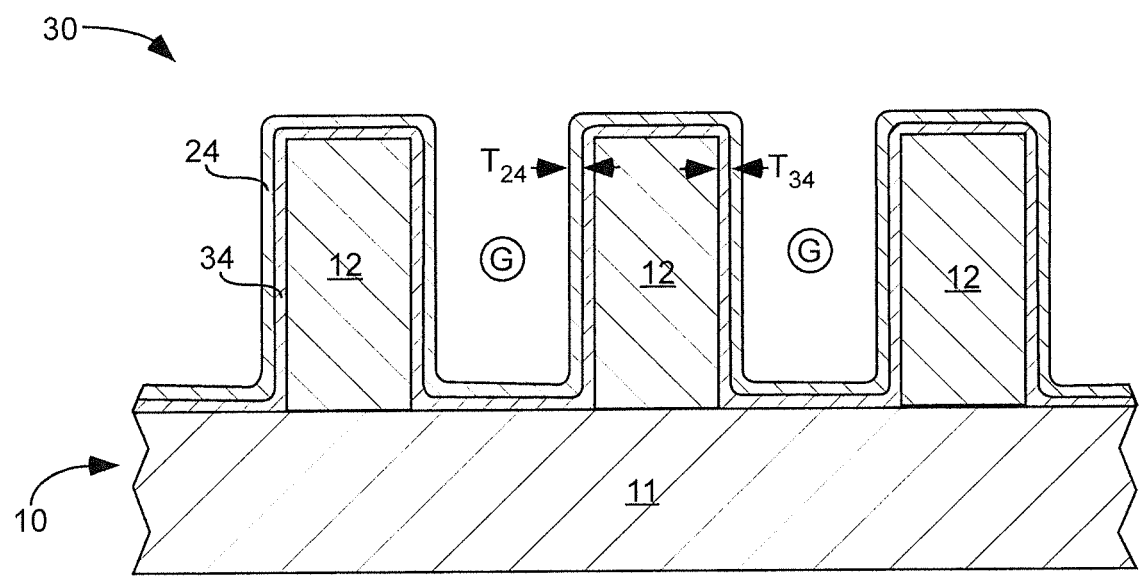

FIG. 3 is a schematic, cross-sectional side-view of a coated device 30 comprising a device 10 with a conformal coating of silicon dioxide 34 and a silane coating 24 on the device 10, in accordance with an embodiment of the present invention.

DEFINITIONS

As used herein, "alkyl" refers to branched, unbranched, cyclic, saturated, unsaturated, substituted, unsubstituted, and heteroalkyl hydrocarbon groups. As used herein, "substituted alkyl" refers to an alkyl substituted with one or more substituent groups, and the term "heteroalkyl" refers to an alkyl in which at least one carbon atom is replaced with a heteroatom. The alkyl can be relatively small to facilitate vapor deposition, such as for example with ≤2 carbon atoms, ≤3 carbon atoms, ≤5 carbon atoms, or ≤10 carbon atoms.

As used herein, "aryl" refers to a group containing a single aromatic ring or multiple aromatic rings that are fused together or linked (such that the different aromatic rings are bound to a common group). The term "substituted aryl" refers to an aryl group comprising one or more substituent groups. The term "heteroaryl" refers to an aryl group in which at least one carbon atom is replaced with a heteroatom. If not otherwise indicated, the term "aryl" includes unsubstituted aryl, substituted aryl, and heteroaryl.

As used herein, the term "conformal coating" means a thin film which conforms to the contours of feature topology.

As used herein, the term "nm" means nanometer(s).

As used herein, the term "Pa" means pascal, the SI unit of pressure.

As used herein, the phrase "X includes a bond to the device" and other similar phrases mean a direct bond between the chemical and the device 10 or a bond to intermediate chemical(s) or layer(s) (e.g. layer of silicon dioxide 34) which is/are bonded to the device 10. Such additional layer(s) can be other conformal-coating(s).

DETAILED DESCRIPTION

A method of vapor depositing a silane chemical onto a device 10 can comprise some or all of the following steps, which can be performed in the following order or other order if so specified. Some of the steps can be performed simultaneously unless explicitly noted otherwise in the claims. There may be additional steps not described below. These additional steps may be before, between, or after those described. The method can comprise (1) placing the device 10 into a chamber 13; (2) applying a conformal coating of silicon dioxide 34 on the device 10; (3) introducing a silane chemical and water into the chamber 13; (4) reacting the silane chemical and the water in the chamber 13 to form $R^1Si(OH)_3$ molecules, $(R^1)_2Si(OH)_2$ molecules, or both; (5) forming a silane coating 24 on the device 10 from a chemical reaction of the $R^1Si(OH)_3/(R^1)_2Si(OH)_2$ molecules with the device 10 and with other $R^1Si(OH)_3/(R^1)_2Si(OH)_2$ molecules, to create a coated device 20 or 30; and (6) introducing $R_2Si(CH_3)_3$ into the chamber 13. See FIGS. 1-3.

The order of steps 1 & 2 can be reversed if the conformal coating of silicon dioxide 34 is applied in a different tool than the chamber 13.

Regarding step 2, examples of thicknesses $T_{34}$ of the conformal coating of silicon dioxide 34 include $\geq 0.5$ nm or $\geq 5$ nm; and $\leq 15$ nm, $\leq 30$ nm, $\leq 45$ nm, or $\leq 60$ nm. This conformal coating of silicon dioxide 34 can aid the adhesion of the silane coating 24 described below.

Regarding step 3, the silane chemical and/or water can be introduced as gases, or can be introduced as liquids that phase change to gases in the chamber. Examples of the silane chemical include $(R^1)_2Si(R^2)_2$, $R^1Si(R^2)_3$, and $Si(R^2)_4$ molecules. Each $R^1$ can be any chemical element or group, such as for example a hydrophobic group, and is further described below. Each $R^2$ can independently be a reactive group such as for example —Cl, —$OR^3$, —$OCOR^3$, —$N(R^3)_2$, or —OH. Each $R^3$ can independently be —$CH_3$, —$CH_2CH_3$, —$CH_2CH_2CH_3$, any other alkyl group, an aryl group, or combinations thereof.

The reactive groups $R^2$ can react with water, thus forming $(R^1)_2Si(OH)_2$, $R^1Si(OH)_3$, and $Si(OH)_4$ molecules respectively. The $(R^1)_2Si(OH)_2$, $R^1Si(OH)_3$, and $Si(OH)_4$ molecules can be formed in the gaseous phase.

In one embodiment, the silane chemical can be introduced first, before introduction of the water, and retained as a gas in the chamber 13 for a period of time, such as for example $\geq 5$ minutes, $\geq 15$ minutes, $\geq 25$ minutes and $\leq 35$ minutes, $\leq 60$ minutes, or $\leq 120$ minutes. Examples of pressure of the chamber 13 while retaining the silane chemical in the chamber 13 include $\geq 1$ Pa, $\geq 5$ Pa, $\geq 10$ Pa, $\geq 50$ Pa, or $\geq 100$ Pa and $\leq 500$ Pa, $\leq 1000$ Pa, $\leq 5000$ Pa, or $\leq 10,000$ Pa. Subsequently, the water can be introduced into the chamber and retained for a period of time, such as for example $\geq 5$ minutes, $\geq 25$ minutes, $\geq 50$ minutes, or $\geq 75$ minutes and $\leq 100$ minutes, $\leq 150$ minutes, or $\leq 200$ minutes. Examples of pressure of the chamber 13 while retaining the water in the chamber 13 include $\geq 100$ Pa, $\geq 500$ Pa, or $\geq 1000$ Pa and $\leq 5000$ Pa, $\leq 10,000$ Pa, or $\leq 50,000$ Pa. Use of a low pressure can allow the silane chemical and the water to be in the gaseous phase at a lower temperature.

Step 4 can also include maintaining the silane chemical and the water simultaneously in the gaseous phase in the chamber for a period of time. A longer period of time can result in improved coverage of the silane coating 24 on the device 10 and/or a thicker silane coating 24 that includes multiple layers. For example, this time can be $\geq 5$ minutes, $\geq 25$ minutes, $\geq 50$ minutes, or $\geq 75$ minutes and $\leq 100$ minutes, $\leq 150$ minutes, or $\leq 200$ minutes. This period of time is one factor in controlling coverage and thickness $T_{24}$ of the silane coating 24 on the device 10.

Step 5, can include forming a silane coating 24 on the device 10 with multiple layers. Silane in the $(R^1)_2Si(OH)_2$, $R^1Si(OH)_3$, and $Si(OH)_4$ molecules can bond to the device 10 and with other $(R^1)_2Si(OH)_2$, $R^1Si(OH)_3$, and $Si(OH)_4$ molecules, thus cross-linking and forming multiple layers. The bond between layers of silane can be a Si—O—Si bond. Step 5 can occur simultaneously with step 3, step 4, or both.

Step 6 can be useful for formation of an inert silane coating 24, by using $R_2Si(CH_3)_3$ to replace —OH, at the end of a silane polymer chain, with $CH_3$.

An amount of water gas in the chamber, during one or more of steps 3-6, can be important for optimal deposition of the silane coating 24. For example, water gas density in the chamber can be $\geq 0.01$ g/m$^3$, $\geq 0.1$ g/m$^3$, $\geq 0.3$ g/m$^3$, or $\geq 1$ g/m$^3$; and $\leq 5$ g/m$^3$, $\leq 10$ g/m$^3$, $\leq 30$ g/m$^3$, or $\leq 100$ g/m$^3$.

The silane coating 24 with multiple-layers can be the result of including $(R^1)_2Si(R_2)_2$ molecules, $R^1Si(R_2)_3$ molecules, $Si(R_2)_4$ molecules, or combinations thereof, in the silane chemical ($R_2$ is defined above). Thus, each $R^2$ can be a reactive group that will react with the water to form $(R^1)_2Si(OH)_2$ molecules, $R^1Si(OH)_3$ molecules, $Si(OH)_4$, or combinations thereof. Each of the —OH functional groups attached to Si can react with the device 10 or the growing silane coating 24, resulting in a multi-layer coating.

The above method can also include controlling an amount of the water in the chamber 13 to achieve a desired thickness $T_{24}$ of the silane coating 24. An increased amount of water gas in the chamber 13, increased silane chemical time in the chamber 13, increased water time in the chamber 13, or combinations thereof, can result in a thicker silane coating 24.

In the above method, the silane chemical can include one or more of: $(CH_3)_2Si(R^2)_2$ molecules, $(CH_3)Si(R^2)_3$ molecules, and $Si(R^2)_4$ molecules, where each $R^2$ can independently be a reactive group as described above. Such molecules can react with water to form $(CH_3)_2Si(OH)_2$ molecules, $(CH_3)Si(OH)_3$ molecules, and $Si(OH)_4$ molecules respectively, which can react together to form one or more of chemical formulas (1)-(6):

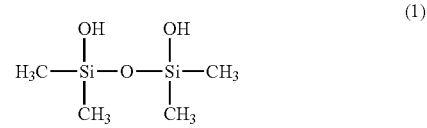

(1)

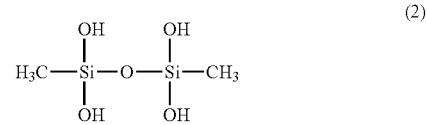

(2)

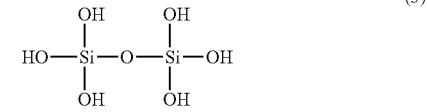

(3)

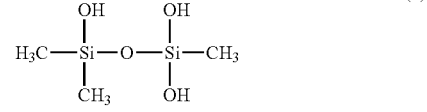

(4)

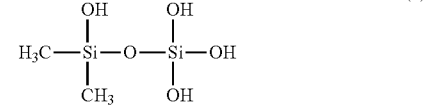

(5)

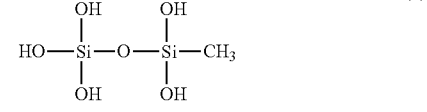

(6)

These reactions can occur in the gaseous phase. Use of these molecules in the silane chemical can result in a durable, high-temperature resistant silane coating 24. Use of (CH₃)Si(R²)₃ and/or Si(R²)₄ molecules can allow formation of a silane coating 24 with multiple layers.

Advantages of vapor deposition include improved control of the thickness T₂₄ of the silane coating 24, reduced process-waste disposal problems, reduced wasted silane chemical, reduced health hazards, reduced or no undesirable residue from rinsing, and use of with standard semiconductor processing equipment.

In the above method, it can be difficult to control the amount of silane introduced into the chamber 13. One way to improve control of the amount of silane is to first dissolve the silane chemical in an organic solvent, then introduce the silane chemical dissolved in the organic solvent into the chamber 13. Alternatively or in addition, water can be dissolved in a separate container of organic solvent, then the water dissolved in the organic solvent can be introduced into the chamber. An organic solvent can be used that will not react with the device 12, such as for example toluene, chloroform, ethanol, and cyclohexanone.

Following are examples of coated devices 20 or 30, which can be manufactured from the above methods. The device 10 can be an inlet liner for gas chromatography comprising a tube. The silane coating 24 can coat an internal surface of the tube, forming an inlet liner with a protective coating. The inert silane coatings 24 described herein can be particularly beneficial for use with such inlet liners.

The device 10 can include nanometer-sized features 12 on a substrate 11. Such device 10 can be a wire grid polarizer and the nm-sized features 12 can be an array of wires, with nanometer-sized width w, height H, and pitch P. The silane coating 24 can coat a surface of the nm-sized features 12 and the substrate 11 as a conformal coating. Use of a conformal coating can allow the silane coating 24 to protect the device 10 with minimal adverse effect on performance of the device 10. The chemistry of the silane coating 24 described herein is particularly useful for the unique needs of a wire grid polarizer, including high-temperature durability, hydrophobicity, and minimal adverse effect on wire grid polarizer performance.

As shown in FIG. 3, the coated device 30 can further comprise a conformal coating of silicon dioxide 34, with a thickness T₃₄ as described above, between the nm-sized features 12 and the silane coating 24.

The silane coating 24 can include:

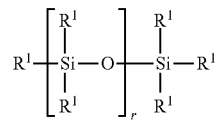

where r can indicate a length of the polymer, such as for example >5, >10, >100, or >500. $R^1$ can be any chemical element or group, such as for example a hydrophobic group or a hydrophilic group. $R^1$ can comprise a carbon chain, which can include a perfluorinated group, such as for example $CF_3(CF_2)_n(CH_2)_m$, where n and m are integers within the boundaries of: $4 \leq n \leq 10$ and $2 \leq m \leq 5$. Other examples of the hydrophobic group are described in USA Patent Publication Number US 2016/0291226, which is incorporated herein by reference.

If the silane chemical includes $(CH_3)_2Si(R^2)_2$ molecules ($R^2$ defined above), the resulting silane coating 24 can be the following polymer, which can be resistant to high temperature:

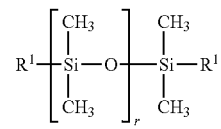

Integer r can have various values, such as for example >5, >10, >100, or >1000. Each $R^1$ can independently be any chemical element or group. $R^1$ can be —CH₃, instead of more reactive chemistry, thus providing an inert, protective coating.

Including $R^1Si(R^2)_3$ molecules and/or $Si(R^2)_4$ molecules ($R^2$ defined above) can facilitate formation of multiple layers in the silane coating 24. Silane in each layer can chemically bond to silane in an adjacent layer. Thicker or multi-layer silane coating 24 can have improved high temperature resistance relative to a thinner or mono-layer silane coating.

The silane coating 24 with multiple layers can include at least three layers, with silane in each layer chemically bonded to silane in an adjacent layer. For example, the silane coating can include:

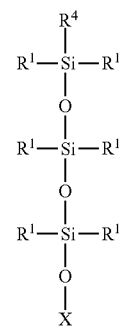

where each $R^4$ can include any chemical element or group, such as for example a hydrophobic group as described herein or a hydrophilic group, and X can include a bond to the device 10. Each $R^1$ can independently be —OSi(CH₃)₃, $R^2$ as defined above, or any other chemical element or group.

It can be important for the silane coating 24 with multiple layers to have sufficient minimum thicknesses $T_L$ for protection of the device 10. For example, testing has shown substantially increased high-temperature durability with increased thicknesses $T_{24}$ of the silane coating 24. Examples of minimum thicknesses $T_L$ of the silane coating 24 with multiple layers include ≥0.7 nm, ≥1 nm, ≥2 nm, ≥2.5 nm, ≥2.7 nm, ≥2.9 nm, and ≥4 nm.

The silane coating 24 can degrade performance of some devices 10, such as for example wire grid polarizers. Thus, it can be important to avoid a thickness $T_{24}$ of the silane coating 24 beyond what is necessary for protection of the device 10. For example, the silane coating 24 with multiple layers can have a maximum thickness $T_H$ of ≤6 nm, ≤8 nm, ≤10 nm, ≤12 nm, ≤15 nm, ≤20 nm, ≤30 nm, or ≤50 nm.

It can be important to minimize variation between the minimum thickness $T_L$ and the maximum thickness $T_H$ of the silane coating 24 to provide protection to the device 10 with minimal degradation of performance. For example, a maximum thickness $T_H$ of the silane coating divided by a minimum thickness $T_L$ of the silane coating 24 can be ≤2, ≤3, ≤5, ≤10, or ≤20.

The silane coating 24 described herein can be vapor deposited as described above in the method of vapor depositing a silane chemical. Vapor deposition, instead of immersion deposition, of the silane coating 24 can result in reduced variation between the minimum thickness $T_L$ and the maximum thickness $T_H$. Vapor-deposition can also be preferred over immersion because of reduced process-waste disposal problems, reduced health hazards, reduced or no undesirable residue from rinsing, and vapor-deposition can be done with standard semiconductor processing equipment.

Use of vapor deposition can avoid dissolution of soluble materials of the device while applying the protective chemistry. In contrast, immersion in a liquid, such as water, can increase the chance of dissolution of such soluble materials. For further description of this benefit of vapor deposition, see USA Patent Publication Number US 2016/0291227, which is incorporated herein by reference.

Examples of vapor-deposition methods include chemical vapor-deposition (CVD), low-pressure CVD (LPCVD), plasma-enhanced CVD, physical vapor-deposition (PVD), atomic layer deposition (ALD), thermoreactive diffusion, electron-beam deposition, sputtering, and thermal evaporation.

Many of the silane coatings 24 described herein can be resistant to high temperature. Such high temperature resistance can be beneficial in many applications, such as for example a wire grid polarizer in a small, high light intensity computer projector or an inlet liner for gas chromatography. Such high temperature resistance can be quantified as follows for a hydrophobic silane coating 24: A water contact angle, of a water drop on a surface of the silane coating 24 can be greater than 120° after heating the coated device 20 or 30 at 350° for ≥80 hours, ≥120 hours, ≥500 hours, ≥1000 hours, or ≥1500 hours.

In the above methods and coated devices 20 and 30, covalent bonds can be formed between the silane coating 24 and the device 10 and/or conformal coating of silicon dioxide 34. In the silane coating 24 with multiple layers, covalent bonds can be formed between silane in each layer and silane in the adjacent layer.

What is claimed is:

1. A method of vapor depositing a silane chemical onto a wire grid polarizer, the method comprising:
   placing the wire grid polarizer into a chamber;
   introducing a silane chemical and water into the chamber, the silane chemical and the water being in a gaseous phase in the chamber, the silane chemical including $R^1Si(R^2)_3$ molecules, where:
   $R^1$ is $CF_3(CF_2)_n(CH_2)_m$ with n and m being integers within the boundaries of 0≤n≤4 and 2≤m≤5;
   each $R^2$ is independently —Cl, —$OR^3$, —$OCOR^3$, or —$N(R^3)_2$; and
   each $R^3$ is independently —$CH_3$, —$CH_2CH_3$, or —$CH_2CH_2CH_3$;
   maintaining the silane chemical and the water simultaneously in the gaseous phase in the chamber and reacting the silane chemical and the water in the chamber to form $R^1Si(OH)_3$ molecules, the $R^1Si(OH)_3$ molecules being gaseous molecules; and
   forming a silane coating on the wire grid polarizer from a chemical reaction of the $R^1Si(OH)_3$ molecules with the wire grid polarizer and with other $R^1Si(OH)_3$ molecules; and
   controlling an amount of the water in the chamber to achieve a thickness of the silane coating of between 2 nm and 20 nm.

2. The method of claim 1, wherein n is an integer within the boundaries of 1≤n≤3.

3. A method of vapor depositing a silane chemical onto a wire grid polarizer, the method comprising:
   placing the wire grid polarizer into a chamber;
   introducing a silane chemical and water into the chamber, the silane chemical and the water being in a gaseous phase in the chamber;
   maintaining the silane chemical and the water simultaneously in the gaseous phase in the chamber and reacting the silane chemical and the water in the chamber to form $(R^1)_2Si(OH)_2$ molecules, where one $R^1$ is —$CH_3$ and the other $R^1$ is independently any chemical element or group; and
   forming a silane coating on the wire grid polarizer from a chemical reaction of the $(R^1)_2Si(OH)_2$ molecules with the wire grid polarizer and with other $(R^1)_2Si(OH)_2$ molecules.

4. The method of claim 3, wherein both $R^1$ are —$CH_3$ and a pair of the $(CH_3)_2Si(OH)_2$ molecules react to form in the gaseous phase:

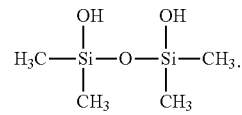

5. The method of 3, further comprising controlling an amount of the water in the chamber to achieve a desired thickness of the silane coating.

6. The method of 3, further comprising applying a conformal coating of silicon dioxide on the wire grid polarizer, before introducing the silane chemical and the water into the chamber, the conformal coating of silicon dioxide having a thickness of ≥0.5 nm and ≤30 nm.

7. A method of vapor depositing a silane chemical onto a wire grid polarizer, the method comprising:
   placing the wire grid polarizer into a chamber;
   introducing a silane chemical and water into the chamber, the silane chemical and the water simultaneously being in a gaseous phase in the chamber;
   the silane chemical including $R^1Si(R^2)_3$ molecules, where $R^1$ is any chemical element or group; each $R^2$ is independently —$OR^3$, —$OCOR^3$, or —$N(R^3)_2$; and
   each $R^3$ is independently —$CH_3$, —$CH_2CH_3$, or —$CH_2CH_2CH_3$;
   reacting the silane chemical and the water in the chamber to form $R^1Si(OH)_3$ molecules; and
   forming a silane coating with multiple layers on the wire grid polarizer, with silane in each layer chemically bonding to silane in an adjacent layer, from a chemical reaction of the $R^1Si(OH)_3$ molecules with the wire grid polarizer and with other $R^1Si(OH)_3$ molecules.

8. The method of claim 7, wherein forming the silane coating with multiple layers on the wire grid polarizer includes forming covalent bonds between silane and the wire grid polarizer, forming covalent bonds between silane in each layer and silane in the adjacent layer, or both.

9. The method of claim 7, wherein the $R^1Si(OH)_3$ molecule is a gaseous molecule.

10. The method of claim 7, further comprising controlling an amount of the water in the chamber to achieve a desired thickness of the silane coating with multiple layers.

11. The method of claim 7, further comprising maintaining the silane chemical and the water simultaneously in the gaseous phase in the chamber for at least 5 minutes.

12. The method of claim 7, wherein $R^1$ is a hydrophobic group with a carbon chain.

13. The method of claim 7, wherein the $R^1Si(OH)_3$ molecules include $Si(OH)_4$ molecules.

14. The method of claim 7, wherein a pair of the $R^1Si(OH)_3$ molecules react to form chemical formula (1), chemical formula (2), chemical formula (3), or combinations thereof:

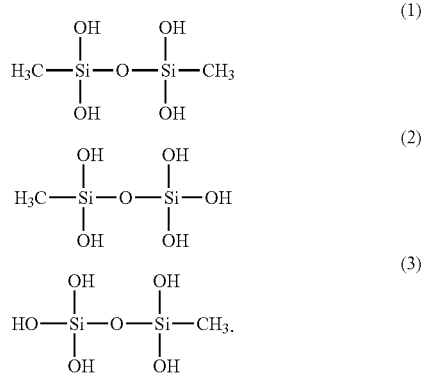

15. The method of claim 7, wherein the silane chemical includes $R^1Si[N(CH_3)_2]_3$ molecules.

16. The method of claim 7, wherein the silane coating with multiple layers has a thickness of at least 2 nm.

17. The method of claim 7, wherein the silane coating with multiple layers has a thickness of between 0.7 nm and 20 nm.

18. The method of claim 7, further comprising dissolving the silane chemical in an organic solvent before the step of introducing the silane chemical and water into the chamber; and wherein introducing the silane chemical and water into the chamber further comprises introducing the silane chemical dissolved in the organic solvent and water into the chamber.

19. The method of claim 7, further comprising dissolving the water in an organic solvent before the step of introducing the silane chemical and the water into the chamber; and wherein introducing the silane chemical and water into the chamber further comprises introducing the water dissolved in the organic solvent and the silane chemical into the chamber.

20. The method of claim 7, further comprising applying a conformal coating of silicon dioxide on the wire grid polarizer, before introducing the silane chemical and the water into the chamber, the conformal coating of silicon dioxide having a thickness of ≥0.5 nm and ≤30 nm.

21. The method of claim 7, wherein a density of the water in the gaseous phase in the chamber is between 0.3 $g/m^3$ and 30 $g/m^3$.

* * * * *